United States Patent
Iwaya et al.

(10) Patent No.: US 9,887,270 B2
(45) Date of Patent: Feb. 6, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Masanobu Iwaya, Matsumoto (JP); Fumikazu Imai, Tsukuba (JP); Takuya Komatsu, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/445,156

(22) Filed: Feb. 28, 2017

(65) Prior Publication Data
US 2017/0271468 A1    Sep. 21, 2017

(30) Foreign Application Priority Data
Mar. 16, 2016   (JP) .................. 2016-053132

(51) Int. Cl.
| H01L 29/45 | (2006.01) |
| H01L 29/16 | (2006.01) |
| H01L 29/66 | (2006.01) |
| H01L 29/40 | (2006.01) |
| H01L 21/02 | (2006.01) |
| H01L 21/04 | (2006.01) |
| H01L 29/78 | (2006.01) |

(52) U.S. Cl.
CPC ........ *H01L 29/45* (2013.01); *H01L 21/02186* (2013.01); *H01L 21/0485* (2013.01); *H01L 29/1608* (2013.01); *H01L 29/401* (2013.01); *H01L 29/66068* (2013.01); *H01L 29/78* (2013.01)

(58) Field of Classification Search
USPC .......................................................... 257/77
See application file for complete search history.

(56) References Cited

U.S. PATENT DOCUMENTS

2004/0214453 A1   10/2004 Endou et al.
2016/0336224 A1*  11/2016 Sugahara ............... H01L 29/45

FOREIGN PATENT DOCUMENTS

JP    3888330 B2    2/2007

* cited by examiner

*Primary Examiner* — Zandra Smith
*Assistant Examiner* — Lawrence Tyner, Jr.
(74) *Attorney, Agent, or Firm* — Rabin & Berdo, P.C.

(57) ABSTRACT

A silicon carbide semiconductor device includes an $n^+$-type SiC substrate, a gate oxide film formed on a portion of the surface of the $n^+$-type SiC substrate, a gate electrode formed on the gate oxide film, an interlayer insulating film formed so as to cover the gate electrode, a TiN film formed so as to cover the interlayer insulating film, and a Ni silicide layer formed on a surface of the $n^+$-type SiC substrate not covered by the interlayer insulating film. The TiN film has two or more layers.

12 Claims, 5 Drawing Sheets

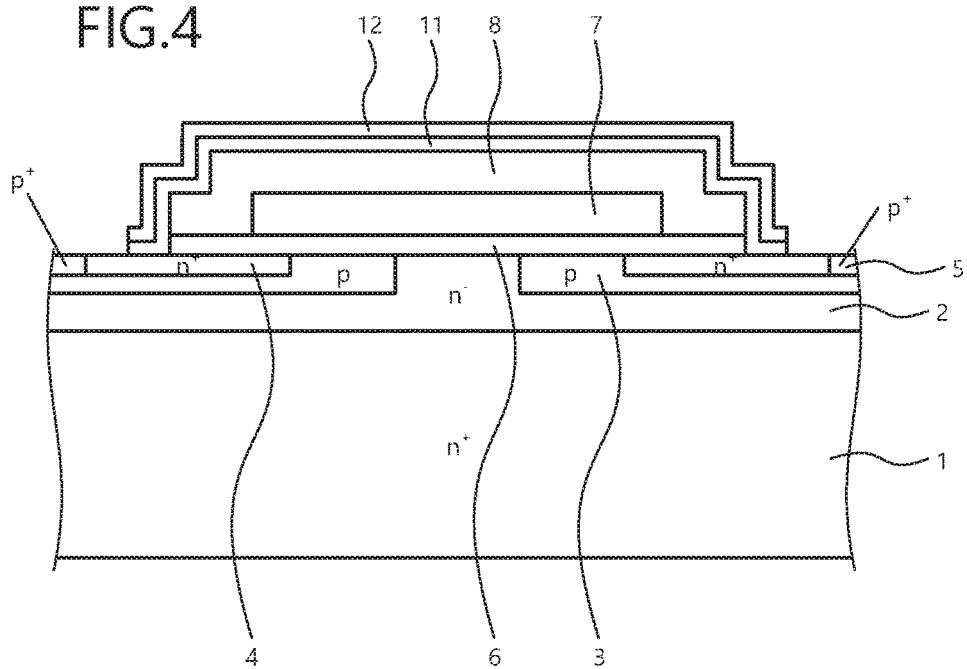
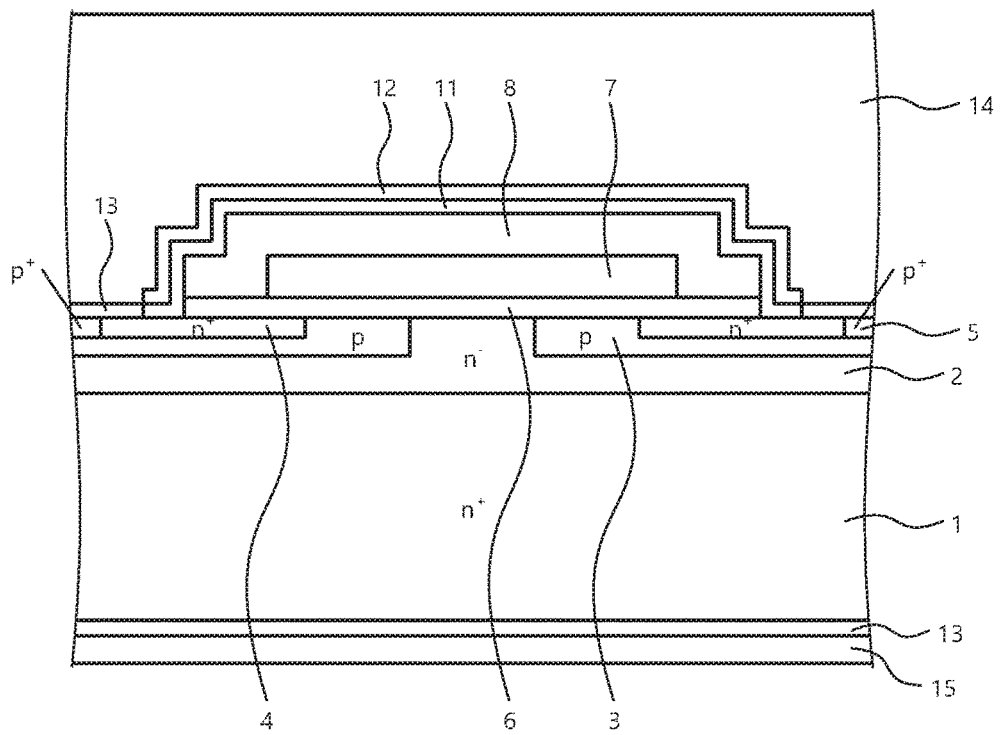

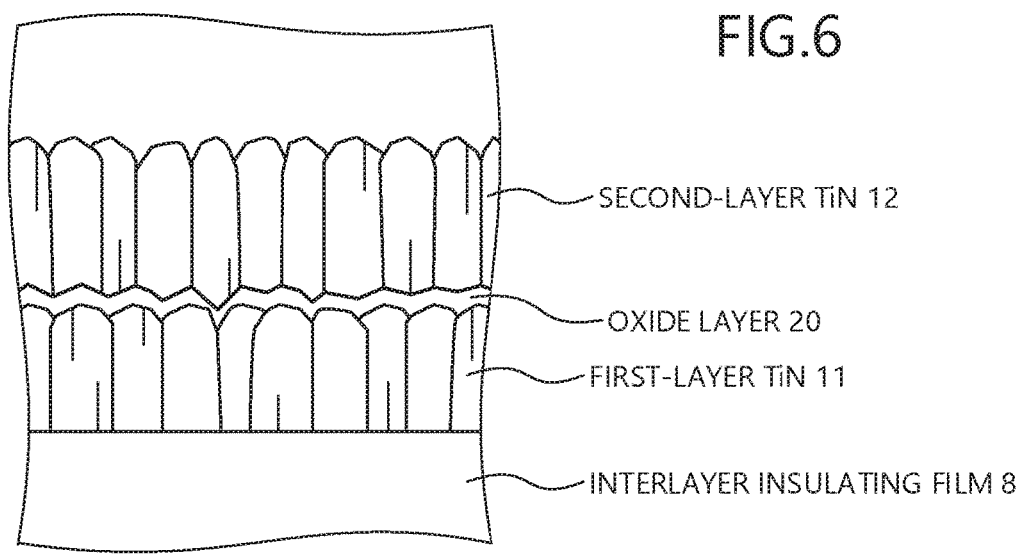

though equivalently. In the description of the embodiments below and the accompanying drawings, main portions that are identical will be given the same reference numerals and will not be repeatedly described.

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-053132, filed on Mar. 16, 2016, the entire contents of which are incorporated herein by reference.

BACKGROUND OF THE INVENTION

1. Field of the Invention

Embodiments of the invention relate to silicon carbide semiconductor device that uses silicon carbide single crystals and a method of manufacturing a silicon carbide semiconductor device.

2. Description of the Related Art

Mainstream semiconductor devices employed as power devices conventionally use silicon as a semiconductor material. However, compared to silicon, silicon carbide (SiC), a wide-bandgap semiconductor, has physical properties such as a thermal conductivity that is 3 times that of silicon, a critical electric field strength that is 10 times that of silicon, and an electron drift velocity that is 2 times that of silicon. Thus, application of these properties as a power device capable of high-temperature operation and having a high dielectric breakdown voltage and low loss is being researched.

Among SiC devices, in power metal oxide semiconductor field effect transistors (MOSFETs) and insulated gate bipolar transistors (IGBTs), a nickel (Ni) silicide is typically used to obtain an ohmic contact with the surface side of the substrate. A method of manufacturing such is as follows. After a desired impurity layer is formed on a SiC substrate, a gate oxide film is formed, and a poly-silicon pattern is formed.

Subsequently, after an interlayer insulating film is formed, an opening is formed by etching, at a location where a contact is necessary. Thereafter, a titanium nitride (TiN) film to prevent Ni from permeating the interlayer insulating film is formed on the entire surface by reactive sputtering or the like to have a thickness of about 100 nm, and a window is opened by dry etching at a portion where a silicide is to be formed.

Subsequently, a Ni film is formed by sputtering or vapor deposition and rapid heat treatment is performed whereby a Ni silicide is formed (for example, refer to Japanese Patent No. 3888330).

SUMMARY OF THE INVENTION

According to one aspect of the present invention, a silicon carbide semiconductor device includes a semiconductor substrate containing silicon carbide; a gate oxide film formed on a portion of a surface of the semiconductor substrate; a gate electrode formed on the gate oxide film; an insulating film formed so as to cover the gate electrode; a TiN film formed so as to cover the insulating film; and an Ni silicide layer formed on the surface of the semiconductor substrate not covered by the insulating film. The TiN film has two or more layers.

In the silicon carbide semiconductor device, the TiN film has a structure in which a first layer that is a lower layer and a second layer that is an upper layer each has a discontinuous columnar structure.

In the silicon carbide semiconductor device, the TiN film has a structure in which an intermediate layer is formed between a first layer and a second layer.

In the silicon carbide semiconductor device, the intermediate layer is an oxide layer.

In the silicon carbide semiconductor device, the TiN film has a first layer and a second layer, the second layer having a thickness that is greater than that of the first layer.

In the silicon carbide semiconductor device, the thickness of the first layer is 10 to 50 nm, the thickness of the second layer is 50 to 90 nm, and a total of the thickness of the first layer and the thickness of the second layer is 100 nm or less.

According to another aspect of the present invention, a method of manufacturing a silicon carbide semiconductor device includes forming a gate oxide film on a surface of a semiconductor substrate containing silicon carbide; forming a gate electrode on the gate oxide film; forming an insulating film on the gate oxide film and the gate electrode; providing a contact hole to open the insulating film and reach the semiconductor substrate; forming a TiN film on an entire surface side of the semiconductor substrate; removing the TiN film formed at a bottom of the contact hole; forming a Ni film on the surface of the semiconductor substrate; and performing rapid heat treatment of the entire semiconductor substrate. The forming the TiN film includes forming two or more layers as the TiN film.

In the method, the forming the TiN film includes forming a first layer, removal from a deposition apparatus thereafter, and forming a second layer on the first layer.

In the method, the forming the TiN film includes forming a first layer and thereafter, interrupting processing and leaving an oxygen atmosphere in a chamber, and forming a second layer on the first layer after evacuation.

In the method, the forming the TiN film includes forming a first layer, removal from a deposition apparatus thereafter, and forming a second layer on the first layer after oxidizing a surface by oxygen plasma treatment.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 1, 2, 3, 4, and 5 are cross-sectional views depicting manufacturing processes of a silicon carbide semiconductor device according to an embodiment of the present invention;

FIG. 6 is a diagram of a columnar structure of TiN films of the silicon carbide semiconductor device according to the embodiment;

DETAILED DESCRIPTION OF THE INVENTION

Figure 1:
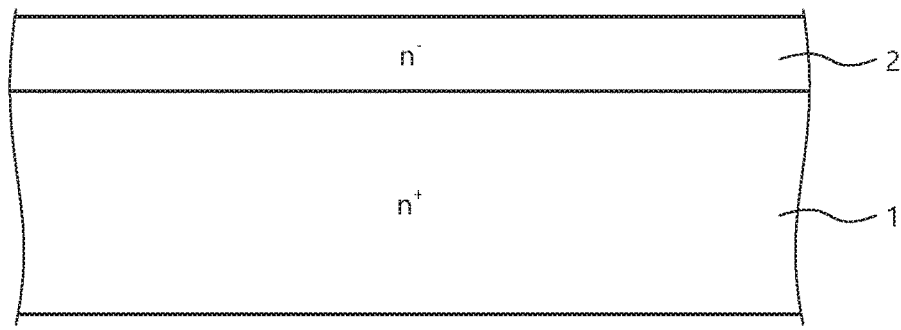

Embodiments of the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A vertical MOSFET will be described as an example of an embodiment of a SiC semiconductor device according to the present invention. FIGS. 1, 2, 3, 4, and 5 are cross-sectional views depicting a method of manufacturing a vertical MOSFET as a silicon carbide semiconductor device according to the embodiment.

Figure 2:
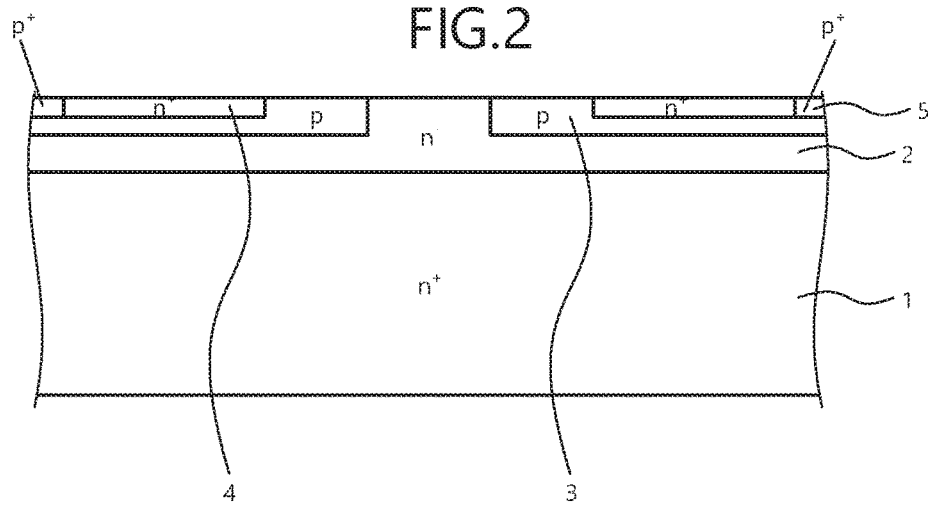

As depicted in FIG. 1, an n⁻-type SiC epitaxial (epi) layer 2 having a thickness of, for example, 15 μm is formed by epitaxial growth on an n⁺-type SiC substrate 1. As depicted in FIG. 2, a p-channel layer 3 is selectively formed on the n⁻-type SiC epi layer 2. In each p-channel layer 3, an n⁺source layer 4 and a p⁺ contact layer 5 are formed by ion implantation and heat treatment for activation is performed at, for example, 1800 degrees C.

Figure 3:
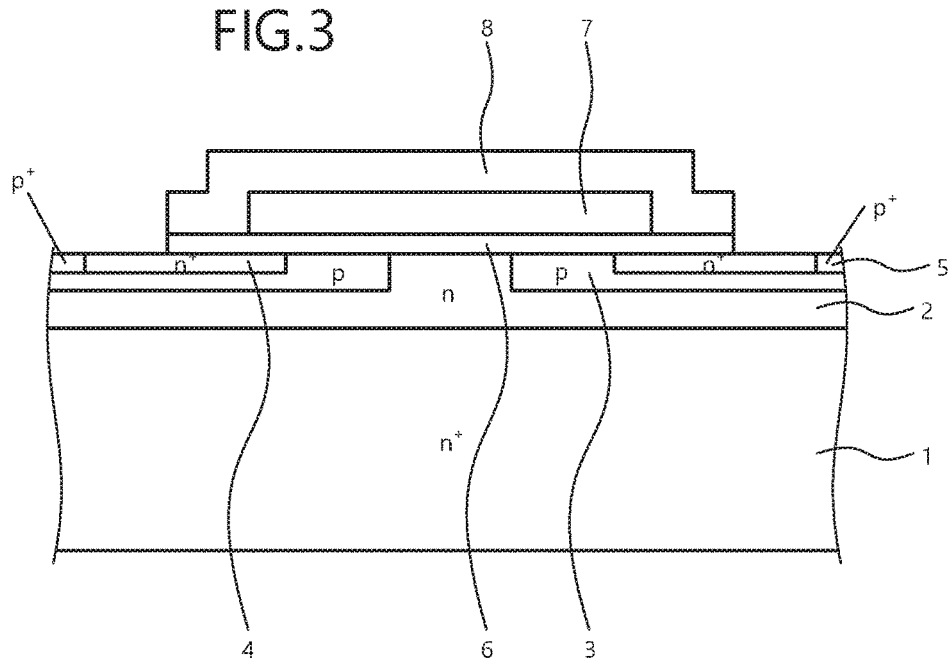

Thereafter, as depicted in FIG. 3, a gate oxide film 6 is formed on a main surface of the n⁺-type SiC substrate 1, and doped poly-silicon 7 is formed on the gate oxide film 6. Formation of a contact and an interlayer insulating film 8 is performed so as to cover the doped poly-silicon 7.

Thereafter, as depicted in FIG. 4, a first-layer TiN film 11 is formed by a sputtering method so as to cover the interlayer insulating film 8 in a deposition apparatus (first deposition chamber). Subsequently, the n⁺-type SiC substrate 1 is removed from the deposition apparatus and exposed to air.

The n⁺-type SiC substrate 1 is again subject to film formation by the deposition apparatus (second deposition chamber that is same of different from the first depoisition chamber) and a second-layer TiN film 12 is formed on the first-layer TiN film 11 by a sputtering method.

After the TiN film in the contact is removed by dry etching, a nickel film is formed on the entire rear surface and a surface side, and rapid heat treatment is performed whereby a nickel silicide layer 13 is formed on the n⁺-type SiC substrate 1 (portion of the n⁺ source layer 4 and the p⁺ contact layer 5) without covering the interlayer insulating film 8.

Metal films to become electrodes are formed on the front surface and rear surface whereby a front electrode 14 and a rear electrode 15 are formed. By the processes described, the vertical MOSFET depicted in FIG. 5 is completed.

FIG. 6 is a diagram of a columnar structure of the TiN films of the silicon carbide semiconductor device according to the embodiment of the present invention.

The vertical MOSFET produced by the method according to the embodiment above has a discontinuous columnar structure in which an oxide layer 20 is formed as an intermediate layer between the first-layer TiN film 11 and the second-layer TiN film 12 as depicted in FIG. 6 whereby resistance to Ni permeation is enhanced.

As a result, decreases in the breakdown voltage of the interlayer insulating film 8 and in the reliability of the element may be suppressed and favorable element characteristics may be obtained.

A state where the thickness of the second-layer (upper layer) TiN film 12 is greater than the thickness of the first-layer (lower layer) TiN film 11 increases the resistance to Ni permeation. In particular, the thickness of the first-layer TiN film 11 may be 10 to 50 nm, the thickness of the second-layer TiN film 12 may be 50 to 90 nm, and the total thereof may be about 100 nm, preferably. When the overall TiN film thickness is up to 150 nm, during subsequent heat treatment, cracking occurs consequent to the difference in the thermal expansion coefficient with the base and therefore, the limit of the thickness is about 100 nm.

Concerning crystal thickness of the columnar structure, greater crystal thickness enables interstices of the crystals to be reduced and resistance to permeation to be enhanced. Therefore, crystal thickness of the second-layer TiN film 12 may be preferably greater than that of the first-layer TiN film 11. Crystal thickness, for example, may be varied by the amount of nitrogen added, the temperature or the deposition pressure at the time of sputtering, or the like.

In the TiN film formation, after the formation of the first-layer TiN film 11 is performed in a deposition chamber, the chamber may be made an oxygen atmosphere and left, and formation of the second-layer TiN film 12 may be performed. By doing so, more assuredly, the oxide layer 20 may be formed to achieve the discontinuous columnar structure.

In the TiN film formation, after the formation of the first-layer TiN film 11 is performed in a first chamber and after an ashing apparatus (second chamber) is used and oxygen plasma treatment is performed, formation of the second-layer TiN film 12 may be performed in a third chamber that is same or different from the first camber. By doing so, more assuredly, the oxide layer 20 may be formed to achieve the discontinuous columnar structure.

The oxide layer 20 sandwiched between the TiN films 11, 12 formed by these methods is extremely thin and therefore, it is possible to open a window by a single dry etching session and thus, there is no increase in the man-hours for etching.

Figure 7:
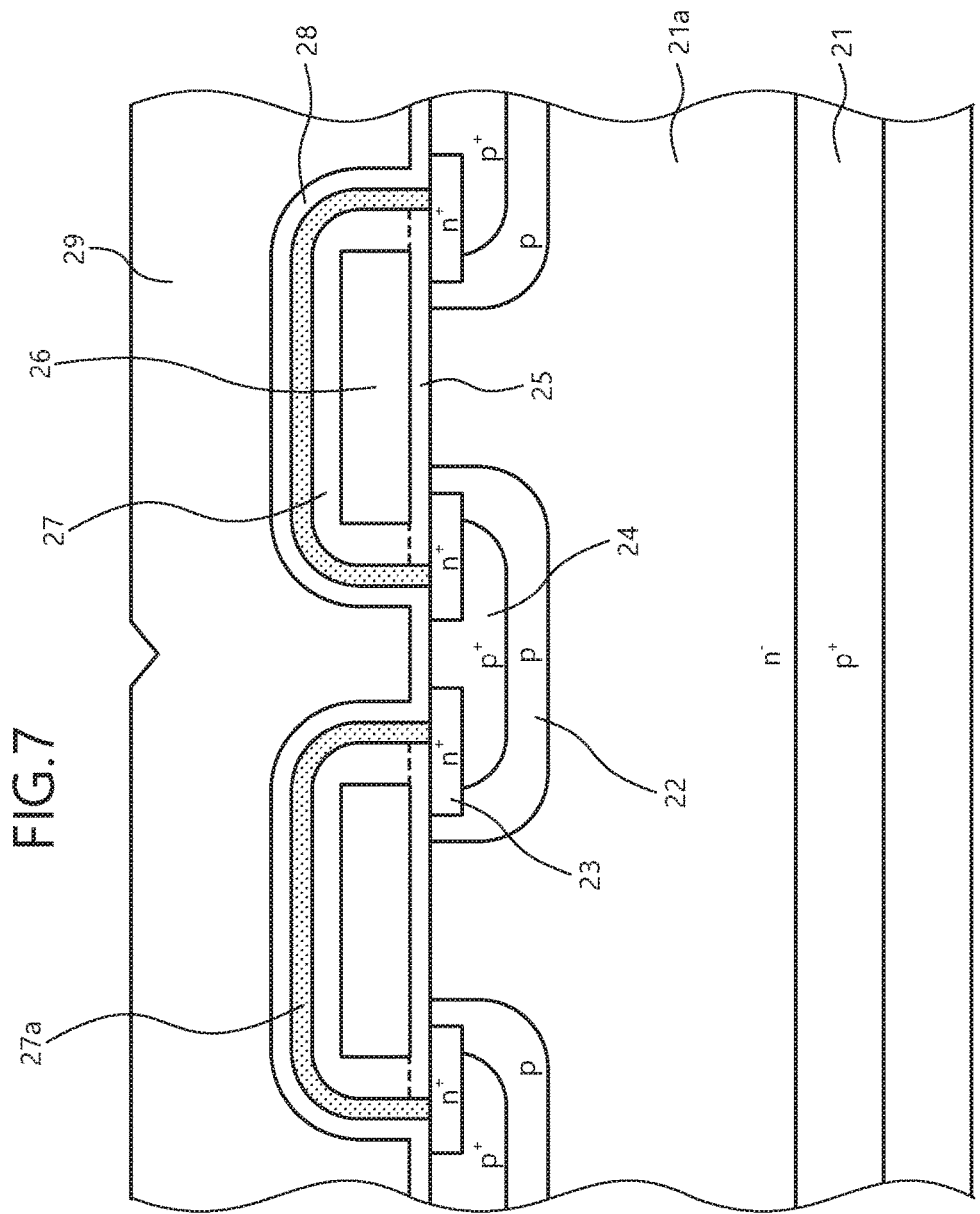
FIG. 7 is cross-section view of another configuration example of the silicon carbide semiconductor device according to the embodiment of the present invention.

FIG. 7 is cross-section view of another configuration example of the silicon carbide semiconductor device according to the embodiment of the present invention. As depicted in FIG. 7, the present invention is further applicable to a vertical IGBT.

In particular, one unit cell (element functional unit) of the active region through which current flows in the ON state is depicted and in the active region, an IGBT structure is provided on a main surface of an n⁻-type drift layer (semiconductor layer) 21a on a SiC substrate (p⁺-type collector region) 21.

The IGBT structure is constituted by a p-type base region 22, an n⁺-type region 23, a p⁺-type region 24, a gate insulating film 25, and a gate electrode 26. In particular, the p-type base region 22 is selectively provided in a surface layer of the main surface of the SiC substrate 21. The n⁺-type region 23 and the p⁺-type region 24 are each selectively provided in the p-type base region 22 so as to be exposed at the main surface of the SiC substrate 21 and to contact each other.

The n⁺-type region 23 is an n⁺-type emitter region. The n⁺-type region 23 is arranged farther outward in the p-type base region 22 than the p⁺-type region 24. The p⁺-type region 24 is a p⁺-type contact region.

On the main surface of the SiC substrate 21, the gate insulating film 25 is provided from a portion of the n⁻-type drift layer 21a between adjacent p-type base regions 22, over the p-type base region 22 and the n⁺-type region 23. The gate electrode 26 is provided on the surface of the gate insulating film 25. In a non-depicted portion, the respective gate electrodes 26 of the unit cell are connected to a gate pad (for example, via a gate runner arranged in a peripheral portion of the chip).

An interlayer insulating film 27 is provided on the surface of the gate electrode 26 so as to cover the gate electrode 26. A protective film 27a is provided on the surface of the interlayer insulating film 27 so as to cover the interlayer insulating film 27. A barrier metal (metal film) 28 of a titanium nitride (TiN) film or the like is formed on the surface of the protective film 27a. The barrier metal 28 contacts the $n^+$-type region 23 and the $p^+$-type region 24 exposed in the contact hole of the interlayer insulating film 27.

When the barrier metal 28 is not present, a front electrode 29 to be an emitter electrode contacts the $n^+$-type region 23 and the $p^+$-type region 24. When the barrier metal 28 is present, the front electrode 29 is electrically connected to the $n^+$-type region 23 and the $p^+$-type region 24 via the barrier metal 28. The rear electrode 15 to be a collector electrode contacts the $p^+$-type collector region 21.

In this manner, without limitation to a MOSFET, the present invention is similarly applicable to an IGBT and formation of a Ni silicide, enables the permeation of Ni into the interlayer insulating film 27 to be stopped, the breakdown voltage of the interlayer insulating film 27 to be enhanced, and the reliability of the semiconductor element to be improved.

The invention described above is not limited to the embodiment described and various modifications are possible within a scope not deviating from the spirit of the present invention. The invention is effective for a method of manufacturing various types of silicon carbide semiconductor devices. For example, the present invention is similarly implemented when the p-type and the n-type are interchanged and when the conductivity of the silicon carbide substrate and the conductivity of an epitaxial layer grown on the main surface of the silicon carbide substrate are the same. The present invention is similarly implemented when, as a substrate, a silicon carbide substrate having a crystal polymorphism other than 4H-SiC is used.

Figure 8:
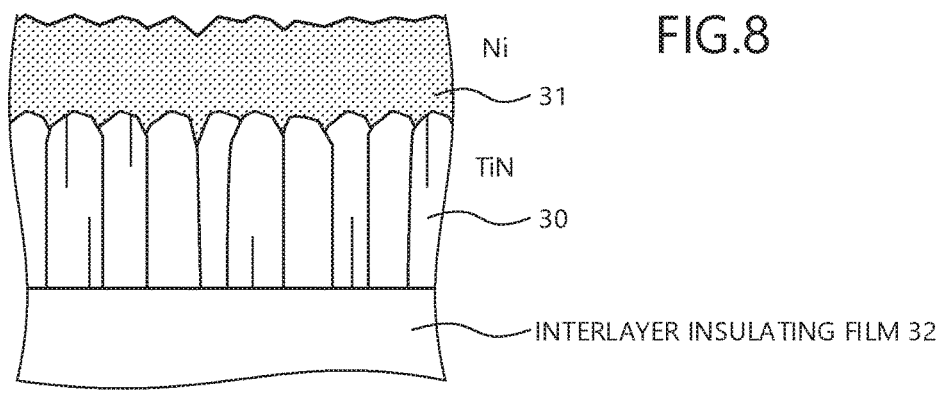
FIG. 8 is a diagram of a conventional columnar structure of a TiN film.
Figure 9:
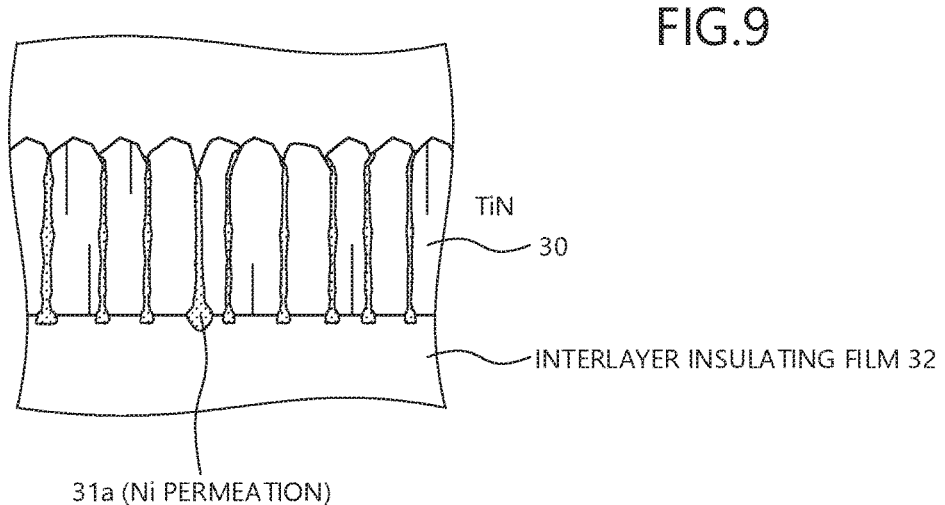
FIG. 9 is a diagram of Ni permeation into an interlayer insulating film.

However, FIG. 8 is a diagram of a conventional columnar structure of a TiN film and FIG. 9 is a diagram depicting Ni permeation into the interlayer insulating film. A TiN film 30 generally has a columnar structure like that depicted in FIG. 8. Therefore, when a Ni silicide is formed by the described conventional method, Ni 31a permeates the TiN film 30 through the crystal interstices as depicted in FIG. 9 and complete blocking of the Ni 31a is impossible. Consequently, the breakdown voltage of the interlayer insulating film (TiN) 32 and the reliability of the element may decrease.

According to the described invention, the oxide layer is formed between the first-layer TiN film and the second-layer TiN film to form a discontinuous columnar structure whereby resistance to Ni permeation is enhanced. As a result, decreases of the breakdown voltage of the interlayer insulating film and of the reliability of the element may be suppressed and favorable element characteristics may be obtained.

According to the present invention, decreases of the breakdown voltage of the interlayer insulating film and of the reliability of the element may be suppressed and favorable element characteristics may be obtained.

As described, the method of manufacturing a silicon carbide semiconductor device according to the present invention is useful in manufacturing a silicon carbide semiconductor device that uses silicon carbide as a semiconductor material and is particularly effective in manufacturing a vertical MOSFET having excellent dielectric breakdown voltage characteristics.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
   a semiconductor substrate containing silicon carbide;
   a gate oxide film formed in an area of a surface of the semiconductor substrate;
   a gate electrode formed on the gate oxide film;
   an insulating film that covers the gate electrode;
   a TiN film that covers the insulating film, the TiN film having at least first and second layers; and
   an Ni silicide layer formed in an area other than the area in which the insulating film is formed, on the surface of the semiconductor.

2. The silicon carbide semiconductor device according to claim 1, wherein the first layer is a lower layer and a second layer is an upper layer, the first layer and the second layer having respective columnar structures that are discontinuous with each other.

3. The silicon carbide semiconductor device according to claim 1, wherein the TiN film further includes an intermediate layer formed between the first layer that is a lower layer and the second layer that is an upper layer.

4. The silicon carbide semiconductor device according to claim 3, wherein the intermediate layer is an oxide layer.

5. The silicon carbide semiconductor device according to claim 1, wherein the first layer is a lower layer, and the second layer is an upper layer having a thickness greater than a thickness of the first layer.

6. The silicon carbide semiconductor device according to claim 5, wherein
   the thickness of the first layer is in the range 10 nm to 50 nm,
   the thickness of the second layer is in the range 50 nm to 90 nm, and
   the TiN film has a total thickness of 100 nm or less.

7. A method of manufacturing a silicon carbide semiconductor device, the method comprising:
   forming a gate oxide film on a surface of a semiconductor substrate containing silicon carbide;
   forming a gate electrode on the gate oxide film;
   forming an insulating film on the gate oxide film and the gate electrode thereof;
   opening the insulating film in an area in which the gate oxide film and the gate electrode are not formed, thereby forming a contact hole that reaches the semiconductor substrate;
   forming a TiN film including at least first and second layers on an entire surface of the semiconductor substrate;
   removing the TiN film formed at a bottom of the contact hole;
   forming a Ni film on the surface of the semiconductor substrate; and
   performing rapid heat treatment of the entire semiconductor substrate.

8. The method of manufacturing a silicon carbide semiconductor device according to claim 7, wherein
   the forming the TiN film includes
      forming the first layer in a first deposition chamber,
      removing the substrate from the first deposition chamber, after the first layer is formed, and forming the second layer on the first layer in a second deposition chamber.

9. The method of manufacturing a silicon carbide semiconductor device according to claim 8, wherein the first and second deposition chambers are a same deposition chamber.

10. The method of manufacturing a silicon carbide semiconductor device according to claim 7, wherein
the forming the TiN film includes
forming the first layer in a deposition chamber,
leaving oxygen in the deposition chamber, after the first layer is formed,
evacuating the oxygen in the deposition chamber, and
forming a second layer on the first layer in an evacuated deposition chamber.

11. The method of manufacturing a silicon carbide semiconductor device according to claim 7, wherein
the forming the TiN film includes
forming the first layer in a first chamber,
removing the substrate from the first chamber, after the first layer is formed,
oxidizing a surface of the first layer of the substrate by oxygen plasma treatment in a second chamber, and
forming the second layer on an oxidized surface of the first layer in a third chamber.

12. The method of manufacturing a silicon carbide semiconductor device according to claim 11, wherein the first and third chambers are a same deposition chamber.

* * * * *